US008008651B2

(12) United States Patent
Kumaki et al.

(10) Patent No.: US 8,008,651 B2
(45) Date of Patent: Aug. 30, 2011

(54) LIGHT-EMITTING ELEMENT AND LIGHT-EMITTING DEVICE

(75) Inventors: Daisuke Kumaki, Nigata (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 434 days.

(21) Appl. No.: 10/575,202

(22) PCT Filed: Aug. 1, 2005

(86) PCT No.: PCT/JP2005/014462
§ 371 (c)(1),
(2), (4) Date: Apr. 10, 2006

(87) PCT Pub. No.: WO2006/013990
PCT Pub. Date: Feb. 9, 2006

(65) Prior Publication Data
US 2007/0090376 A1 Apr. 26, 2007

(30) Foreign Application Priority Data
Aug. 3, 2004 (JP) ................. 2004-226293

(51) Int. Cl.
*H01L 35/24* (2006.01)
*H01L 51/00* (2006.01)
(52) U.S. Cl. ............... 257/40; 257/79; 257/80; 257/85; 257/E33.064
(58) Field of Classification Search ........... 257/40, 257/79, 80, E33.064, 85
See application file for complete search history.

(56) References Cited

U.S. PATENT DOCUMENTS

| 5,703,436 | A | * | 12/1997 | Forrest et al. | 313/506 |
| 6,614,176 | B2 | * | 9/2003 | Kim et al. | 313/506 |
| 6,717,358 | B1 | | 4/2004 | Liao et al. | 313/504 |
| 6,720,092 | B2 | * | 4/2004 | Hatwar | 428/690 |
| 6,765,349 | B2 | * | 7/2004 | Liao et al. | 313/504 |
| 6,844,672 | B2 | | 1/2005 | Yamazaki | |

(Continued)

FOREIGN PATENT DOCUMENTS

EP 1 318 553 A2 6/2003

(Continued)

OTHER PUBLICATIONS

International Search Report re application No. PCT/JP2005/014462, dated Nov. 1, 2005.

(Continued)

*Primary Examiner* — Eugene Lee
*Assistant Examiner* — Anthony Ho
(74) *Attorney, Agent, or Firm* — Husch Blackwell LLP

(57) ABSTRACT

It is an object of the present invention to provide a light-emitting element having, between a pair of electrodes, a layer containing a light-emitting material and a transparent conductive film, wherein the electric erosion of the transparent conductive film and reflective metal can be prevented and to provide a light-emitting device using the light-emitting element. According to the present invention, a first layer 102 containing a light-emitting material, a second layer 103 containing an N-type semiconductor, a third layer 104 including a transparent conductive film, and a fourth layer 105 containing a hole-transporting medium are provided between an anode 101 and a cathode 106, wherein the first layer 102, the second layer 103, the third layer 104, the fourth layer 105, and the cathode 106 are provided in order, and wherein the cathode has a layer containing reflective metal.

35 Claims, 6 Drawing Sheets

U.S. PATENT DOCUMENTS

| | | | |
|---|---|---|---|
| 6,876,144 B2 * | 4/2005 | Peng | 313/504 |
| 7,247,512 B2 | 7/2007 | Yamazaki | |
| 7,273,663 B2 * | 9/2007 | Liao et al. | 428/690 |
| 7,365,486 B2 * | 4/2008 | Lee et al. | 313/504 |
| 2002/0134984 A1 * | 9/2002 | Igarashi | 257/79 |
| 2002/0153243 A1 | 10/2002 | Forrest et al. | |
| 2003/0048072 A1 * | 3/2003 | Ishihara et al. | 313/506 |
| 2003/0127967 A1 | 7/2003 | Tsutsui et al. | 313/498 |
| 2003/0189401 A1 | 10/2003 | Kido et al. | |
| 2004/0022664 A1 | 2/2004 | Kubota et al. | 420/550 |
| 2005/0098207 A1 | 5/2005 | Matsumoto et al. | 136/263 |
| 2005/0156197 A1 | 7/2005 | Tsutsui et al. | 257/200 |
| 2006/0124920 A1 | 6/2006 | Kimura | |
| 2007/0182317 A1 | 8/2007 | Kido et al. | |

FOREIGN PATENT DOCUMENTS

| | | |
|---|---|---|
| EP | 1 351 558 A1 | 10/2003 |
| EP | 1 408 563 A2 | 4/2004 |
| EP | 1 530 245 A2 | 5/2005 |
| GB | 2417827 | 3/2006 |
| JP | 2000-215984 | 8/2000 |
| JP | 2003-089864 | 3/2003 |
| JP | 2003-92191 | 3/2003 |
| JP | 2003-264085 | 9/2003 |
| JP | 2003-272855 | 9/2003 |
| JP | 2003-272860 | 9/2003 |
| JP | 2004-281371 | 10/2004 |
| JP | 2005-166637 | 6/2005 |
| JP | 2005-251587 | 9/2005 |

OTHER PUBLICATIONS

Written Opinion re application No. PCT/JP2005/014462, dated Nov. 1, 2005.

European Search Report re application No. EP 05768584.4, dated Jun. 7, 2010.

Tang, C.W., "Two-Layer Organic Photovoltaic Cell," Applied Physics Letters, vol. 48, No. 2, Jan. 13, 1986, pp. 183-185.

Pfeiffer, M. et al, "33.3: Invited Paper: OLEDS with Doped Transport Layers for Highly Efficient Displays," SID 03 Digest, 2003, pp. 1076-1079.

* cited by examiner

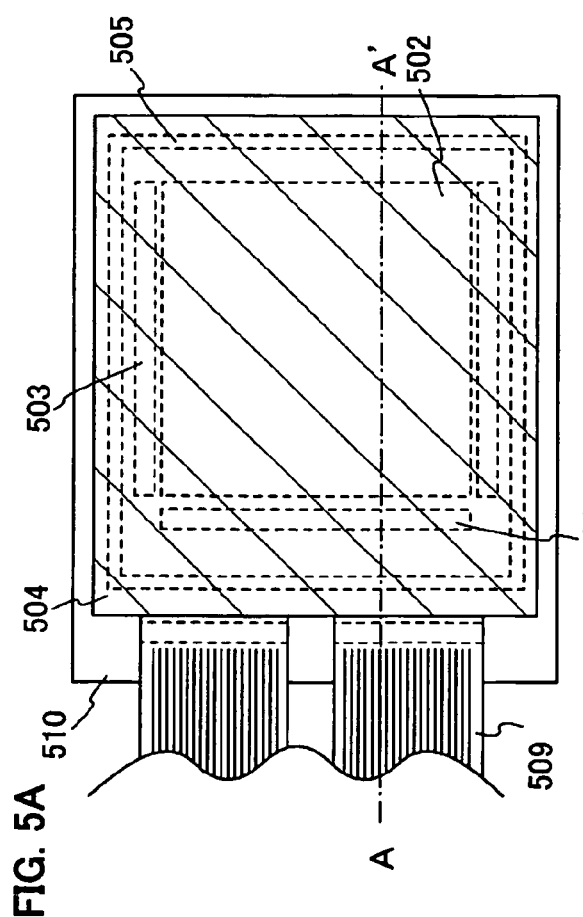
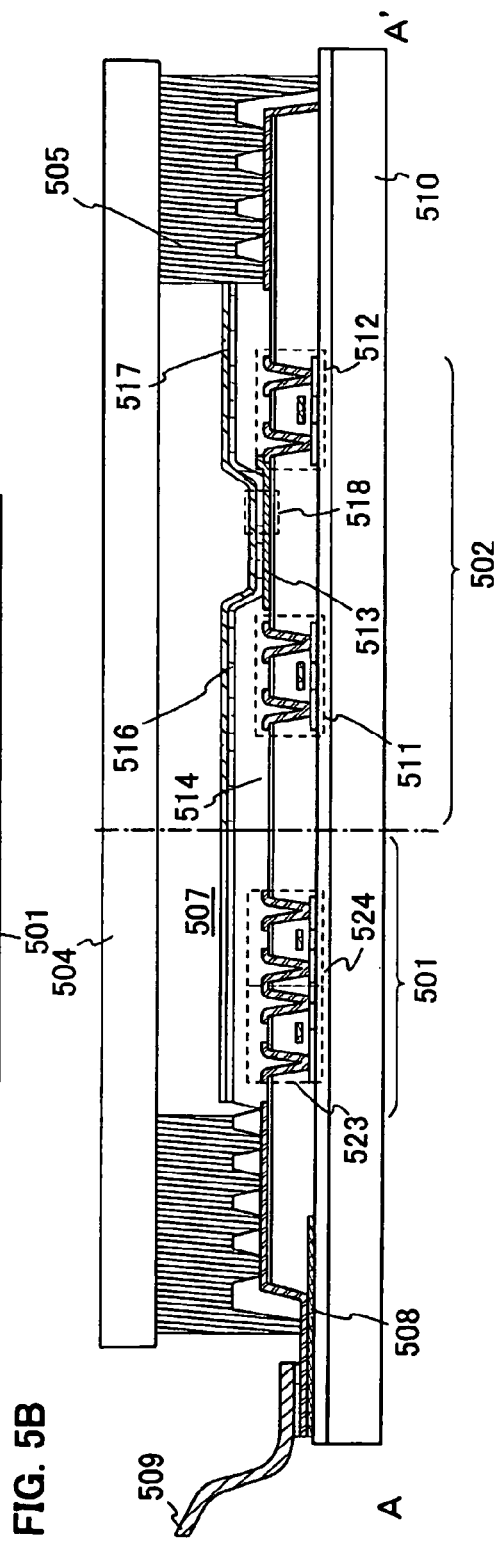
FIG. 5A
FIG. 5B

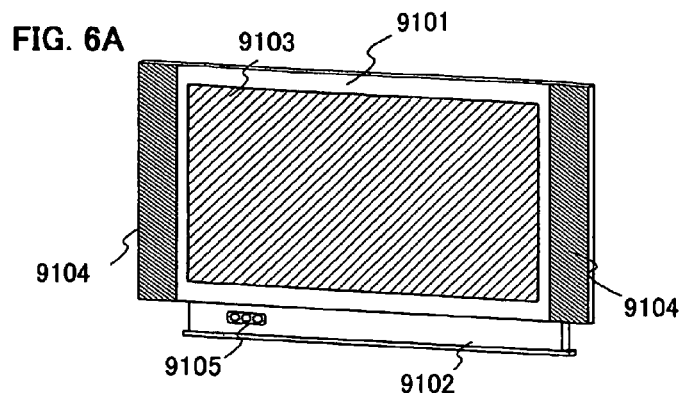
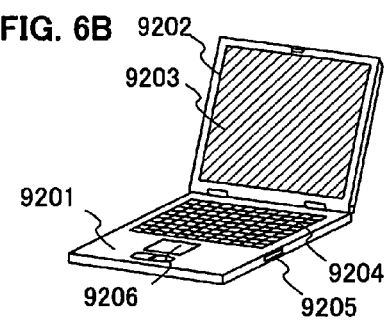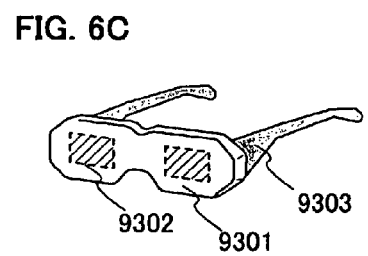
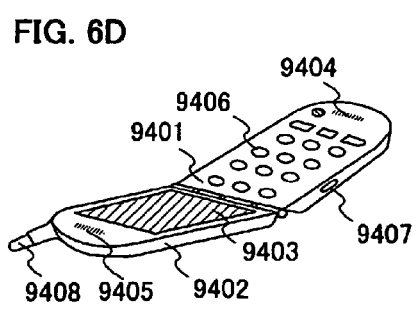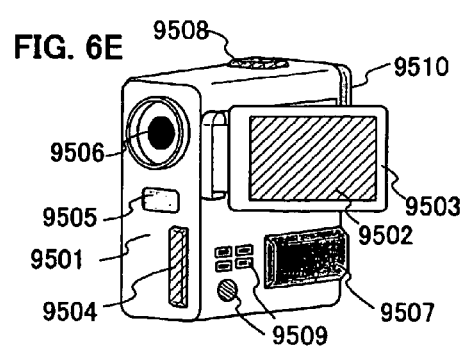

LIGHT-EMITTING ELEMENT AND LIGHT-EMITTING DEVICE

TECHNICAL FIELD

The present invention relates to a light-emitting element having a pair of electrodes and a layer containing an organic compound which emits light by applying an electric field thereto. The present invention further relates to a light-emitting device having such a light-emitting element.

BACKGROUND ART

A light-emitting element using a light-emitting material has advantages of thinness, lightness in weight, fast response, direct-current low-voltage driving, and so on, and is expected to be applied to a next-generation flat panel display. Further, a light-emitting device having light-emitting elements arranged in a matrix pattern is superior to a conventional liquid crystal display device in a wide viewing angle and high visibility.

A light-emitting element is said to have the following light-emission mechanism; voltage is applied to a light-emitting layer sandwiched between a pair of electrodes, electrons injected from a cathode and holes injected from an anode are recombined in a light-emission center of the light-emitting layer to form molecular excitons, and then light is emitted by releasing energy when the molecular exciton returns to the ground state. As the excited state, a singlet-excited state and a triplet-excited state are known, and the light emission is considered possible via either one of the excited states.

In order to enhance the characteristic of such a light-emitting element, the improvement of the element structure, the development of the material, and so on have been conducted.

For example, a method in which an optical length L from a light-emitting portion to a reflective electrode is controlled by sandwiching ITO between the light-emitting portion and the reflective metal is given as means for increasing the external quantum efficiency without deteriorating the luminance by controlling the distance from the light-emitting region to the reflective metal (see, for example, Reference 1: Japanese Patent Application Laid-Open No.: 2003-272855).

An element structure disclosed in Reference 1 is schematically shown in FIG. 2. In this element structure, a transparent electrode 201, a light-emitting portion 202, a transparent conductive film 203, and a metal electrode 204 are stacked. By adjusting the thickness of the transparent conductive film 203, the optical length L from the light-emitting region to the metal electrode is optimized to increase the external quantum efficiency.

However, according to the structure disclosed in Reference 1, since the transparent conductive film 203 and the reflective metal (metal electrode) 204 are in contact, electric erosion might occur due to the difference in their self-potential (see, for example, Reference 2: Japanese Patent Application Laid-Open No.: 2003-89864). Reference 2 describes the self-potential measured using a sodium chloride solution of 3.5% (liquid temperature of 27° C.) and using silver/silver chloride as a reference electrode. Under this condition, the self-potential of aluminum known as reflective metal having high reflectivity is approximately −1550 mV, while that of ITO serving as a transparent conductive film ($In_2O_3$-10 wt % $SnO_2$) is approximately −1000 mV. Thus, the difference between these self-potentials is large. Therefore, it is very likely that oxidation-reduction reaction progresses at an interface between aluminum and ITO, which results in electric erosion.

The self-potential is potential of a reaction to a reference electrode when the reaction is soaked in a certain solution in such a state that current is not applied from outside, that is, potential in a closed loop and is also referred to as resting potential.

DISCLOSURE OF INVENTION

In view of the above problems, it is an object of the present invention to provide a light-emitting element having, between a pair of electrodes, a layer containing a light-emitting material and a transparent conductive film, wherein electric erosion of the transparent conductive film and reflective metal can be prevented. Moreover, it is an object of the present invention to provide a light-emitting device using the light-emitting element.

According to the present invention, a light-emitting element includes a first layer containing a light-emitting material, a second layer containing an N-type semiconductor, a third layer including a transparent conductive film, and a fourth layer containing a hole-transporting medium, wherein the first layer, the second layer, the third layer, and the fourth layer are sandwiched between an anode and a cathode, wherein the first layer, the second layer, the third layer, the fourth layer are provided in order, and wherein the cathode has a layer containing reflective metal.

In the above structure, the reflective metal is aluminum (Al), silver (Ag), or alloy containing Al or Ag such as AlLi alloy or MgAg alloy.

Moreover, the third layer including the transparent conductive film can be formed with indium tin oxide, indium tin oxide containing silicon, indium oxide containing zinc oxide by 2 to 20%, or the like.

In the above structure, the second layer containing an N-type semiconductor and the fourth layer containing a hole-transporting medium may be formed in either a single-layer structure or a multilayer structure in which plural layers are stacked. Here, the N-type semiconductor is preferably metal oxide, particularly any one of zinc oxide, tin oxide, and titanium oxide, or a compound containing two or more of zinc oxide, tin oxide, and titanium oxide.

According to the present invention, a light-emitting element comprises a first layer containing a light-emitting material, a second layer containing an organic compound and an electron-supplying material, a third layer including a transparent conductive film, and a fourth layer containing a hole-transporting medium, wherein the first layer, the second layer, the third layer, and the fourth layer are sandwiched between an anode and a cathode, wherein the first layer, the second layer, the third layer, the fourth layer are provided in order, and wherein the cathode has a layer containing reflective metal.

In the above structure, the second layer containing an organic compound and an electron-supplying material and the fourth layer containing a hole-transporting medium may be formed in either a single-layer structure or a multilayer structure where plural layers are stacked. Here, the organic compound is preferably an organic compound having electron-transporting properties, particularly a metal complex having a ligand including a π-conjugated skeleton. The electron-supplying material is preferably alkali metal, alkali-earth metal, or rare-earth metal.

In the above structure, the cathode may be formed with reflective metal in a single-layer structure or may be formed by stacking reflective metal and another electrode material.

With the structure of the present invention, the reflective metal and the transparent conductive film are not in direct contact; therefore, the electric erosion due to the difference in the self-potentials can be prevented.

BRIEF DESCRIPTION OF DRAWINGS

In the accompanying drawings:

FIGS. 5A and 5B illustrate a light-emitting device; and

FIGS. 6A to 6E illustrate electric appliances.

BEST MODE FOR CARRYING OUT THE INVENTION

Embodiment Mode and Embodiments of the present invention are hereinafter described with reference to the drawings. However, the present invention is not limited to the following description. It is to be understood by those skilled in the art that the modes and details of the present invention can be changed and modified without departing from the scope of the present invention. Therefore, the present invention is not limited to the description of the following Embodiment Mode and Embodiments.

Embodiment Mode 1

Figure 1:
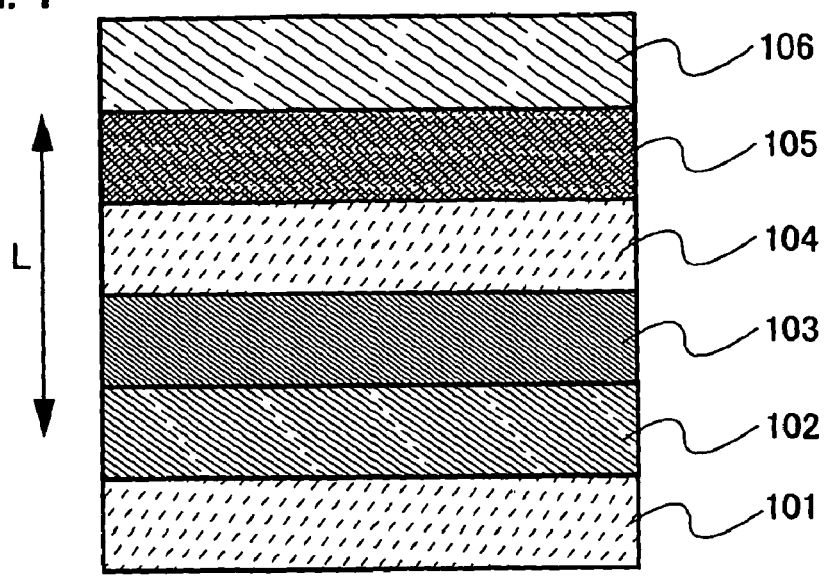
FIG. 1 illustrates an element structure of a light-emitting element according to the present invention.
Figure 2:
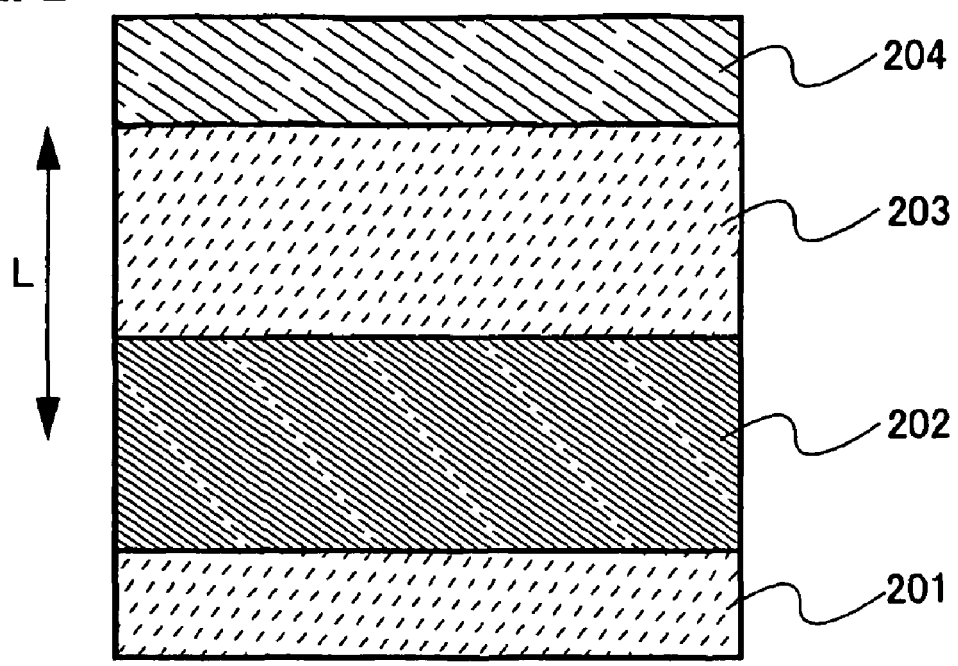
FIG. 2 illustrates an element structure of a conventional light-emitting element.

FIG. 1 schematically shows an element structure of a light-emitting element in the present invention. In the light-emitting element of the present invention, a first layer 102, a second layer 103, a third layer 104, and a fourth layer 105 are provided between an anode 101 and a cathode 106 in order from the anode 101 toward the cathode 106.

In this embodiment mode, the cathode 106 is formed with reflective metal, and light emitted from the first layer 102 is extracted from the anode side.

The anode 101 is preferably formed with a light-transmitting material, specifically indium tin oxide (abbreviated to ITO), indium tin oxide containing silicon, and indium oxide containing zinc oxide by 2 to 20%, or the like.

The first layer 102 is a layer containing a light-emitting material and is formed with a known material. The first layer 102 may be formed in either a single-layer structure or a multilayer structure. For example, not only the light-emitting layer but also an electron-injecting layer, an electron-transporting layer, a hole-blocking layer, a hole-transporting layer, a hole-injecting layer, and the like may be freely combined and provided as the first layer 102. Moreover, a mixed layer or mixed junction in which these layers are mixed may be formed. The layer structure of the light-emitting layer is changeable. Such modification as providing an electrode for the electron injection and diffusing the light-emitting material instead of the particular electron-injecting region and the light-emitting region is allowable within the scope of the present invention.

The second layer 103 contains a material having a donor level for generating electrons. Specifically, the second layer 103 consists of or contains an N-type semiconductor such as zinc oxide, tin oxide, titanium oxide, zinc sulfide, zinc selenide, or zinc telluride. Alternatively, the second layer 103 may have a structure doped with a material having electron-supplying properties to an organic compound. The organic compound here is preferably an electron-transporting material such as 2-(4-biphenylyl)-5-(4-tert-butylphenyl)-1,3,4-oxadiazole (abbreviated to PBD), the above-mentioned OXD-7, TAZ, p-EtTAZ, BPhen, or BCP. Besides, a metal complex having a quinoline skeleton or benzoquinoline skeleton in which the drive voltage has been conventionally increased, such as $Alq_3$, tris(5-metyl-8-quinolinolato)aluminum (abbreviated to $Almq_3$), or bis(10-hydroxybenzo[h]quinolinato)beryllium (abbreviated to $BeBq_2$), or bis(2-metyl-8-quinolinolato)-4-phenylphenolato-aluminum (abbreviated to BAlq) is given. On the other hand, the electron-supplying material is, for example, alkali metal such as Li or Cs, Mg, alkali-earth metal such as Ca, Sr, or Ba, or rare-earth metal such as Er or Yb. In addition, an organic compound having electron-supplying properties to $Alq_3$ such as tetrathiafulvalene or tetra methyl thiafulvalene may also be used.

The third layer 104 has light-transmitting properties and contains a carrier-generating material. Specifically, a transparent conductive film such as indium tin oxide (abbreviated to ITO), indium tin oxide containing silicon, or indium oxide containing zinc oxide by 2 to 20% can be used.

The fourth layer 105 contains a hole-transporting medium. The hole-transporting medium is, for example, a hole-transporting material containing an organic compound, a material doped with a material having electron-receiving properties to an organic compound, or a hole-transporting material containing an inorganic compound. The fourth layer 105 can be formed with these hole-transporting mediums, and it is preferable to use a material having an acceptor level for generating holes, that is, a material doped with a material having electron-receiving properties to an organic compound, or a hole-transporting material containing an inorganic compound.

When the fourth layer contains a hole-transporting material containing an organic compound, the hole-transporting material is preferably a compound having an aromatic amine skeleton (that is, a compound having a bond of a benzene ring-nitrogen). For example, the following material is widely used; N,N'-bis(3-metylphenyl)-N,N'-diphenyl-[1,1'-biphenyl]-4,4'-diamine (abbreviated to TPD), a derivative thereof such as 4,4'-bis[N-(1-naphtyl)-N-phenyl-amino]-biphenyl (abbreviated to α-NPD), or a starburst aromatic amine compound such as 4,4',4"-tris(N-carbazolyl)-triphenylamine (abbreviated to TCTA), 4,4',4"-tris(N,N-diphenyl-amino)-triphenylamine (abbreviated to TDATA), or 4,4',4"-tris[(N-(3-methylphenyl)-N-phenyl-amino]triphenylamine (abbreviated to MTDATA).

Moreover, when the fourth layer 105 has a structure doped with a material having electron-receiving properties to an organic compound, the organic compound to be used is preferably a hole-transporting material, and a compound having an aromatic amine skeleton is preferred. For example, in addition to TPD, α-NPD (derivative of TPD), or a starburst aromatic amine compound such as TDATA or MTDATA is given. On the other hand, as the electron-receiving material, for example metal oxide having electron-receiving properties to α-NPD, such as molybdenum oxide, vanadium oxide, or rhenium oxide is given. Further, another organic compound having electron-receiving properties to α-NPD, such as tetra cyanoquino dimethane (abbreviated to TCNQ) or 2,3-dicyano naphthoquinone (abbreviated to DCNNQ) may also be used.

When the fourth layer 105 contains a hole-transporting material containing an inorganic compound, the fourth layer 105 may consist of or contain a P-type semiconductor such as vanadium oxide, chromium oxide, molybdenum oxide, cobalt oxide, or nickel oxide.

The cathode 106 is preferably formed with metal having high reflectivity. For example, aluminum (Al), silver (Ag), or alloy containing Al or Ag such as AlLi alloy or MgAg alloy can be used. Moreover, the cathode 106 may be formed in a multilayer structure of reflective metal and another electrode material. For example, a multilayer of calcium (Ca) and Ag, a multilayer of Ca and Al, or a multilayer of Li and Al is applicable. The electron-injecting properties can be increased by forming a multilayer of reflective metal and a thin film (for example of approximately 5 nm thick) of alkali metal or alkali-earth metal.

According to the structure shown in this embodiment mode, the fourth layer 105 is provided between the cathode 106 and the third layer 104, and the cathode 106 formed with reflective metal and the third layer 104 including the transparent conductive film are not in direct contact. Therefore, electric erosion due to the difference in the self-potential can be prevented. That is to say, the reaction of the reflective metal and the transparent conductive film can be prevented.

Not only the third layer 104 including the transparent conductive film but also the fourth layer 105 can have any thickness. Therefore, the degree of freedom to optimize the optical length L to the reflective metal from the light-emitting region in the first layer 102 containing the light-emitting material increases further. For this reason, the optical length can be optimized more easily so as to increase the external quantum efficiency or to increase the color purity of the emission light.

Since the first layer 102, the second layer 103, the third layer 104, the fourth layer 105, and the cathode 106 are stacked, holes and electrons can be generated from the third layer. Since the second layer 103 contains a material having a donor level for generating electrons, the barrier for electrons to move from the third layer 104 to the second layer 103 is low. Therefore, the electrons are easily moved to the second layer 103 and recombined with the holes injected from the anode in the first layer 102, thereby emitting light. On the other hand, the holes generated from the third layer 104 including the transparent conductive film is easily moved to the fourth layer 105 containing the hole-transporting medium because the barrier for the holes to move from the third layer 104 to the fourth layer 105 is low, and then the holes are transported to the cathode 106.

That is to say, in the structure according to the present invention, the substantial moving distance of the electrons can be shortened, thereby decreasing the drive voltage. Therefore, when the optical length is optimized to increase the external quantum efficiency or the color purity and the distance to the reflective metal from the light-emitting region in the layer containing the light-emitting material is set to a certain distance, the substantial moving distance of the electrons can be shortened by employing the present invention, thereby decreasing the drive voltage.

Moreover, even in the case of extending the distance to the reflective metal from the light-emitting region in the layer containing the light-emitting material and increasing the film thickness in order to optimize the optical length, the increase in the drive voltage can be suppressed.

The contact resistance between the second layer 103 and the fourth layer 105 can be reduced by stacking the second layer 103 and the fourth layer 105 with the third layer 104 sandwiched therebetween. This makes it possible to decrease the drive voltage further. Because of the third layer 104 sandwiched therebetween, the materials for the second layer 103 and the fourth layer 105 can be selected from a wider range.

It is preferable that the contact resistance between the second layer 103 and the third layer 104 and the contact resistance between the third layer 104 and the fourth layer 105 be low.

Embodiment 1

Figure 3:
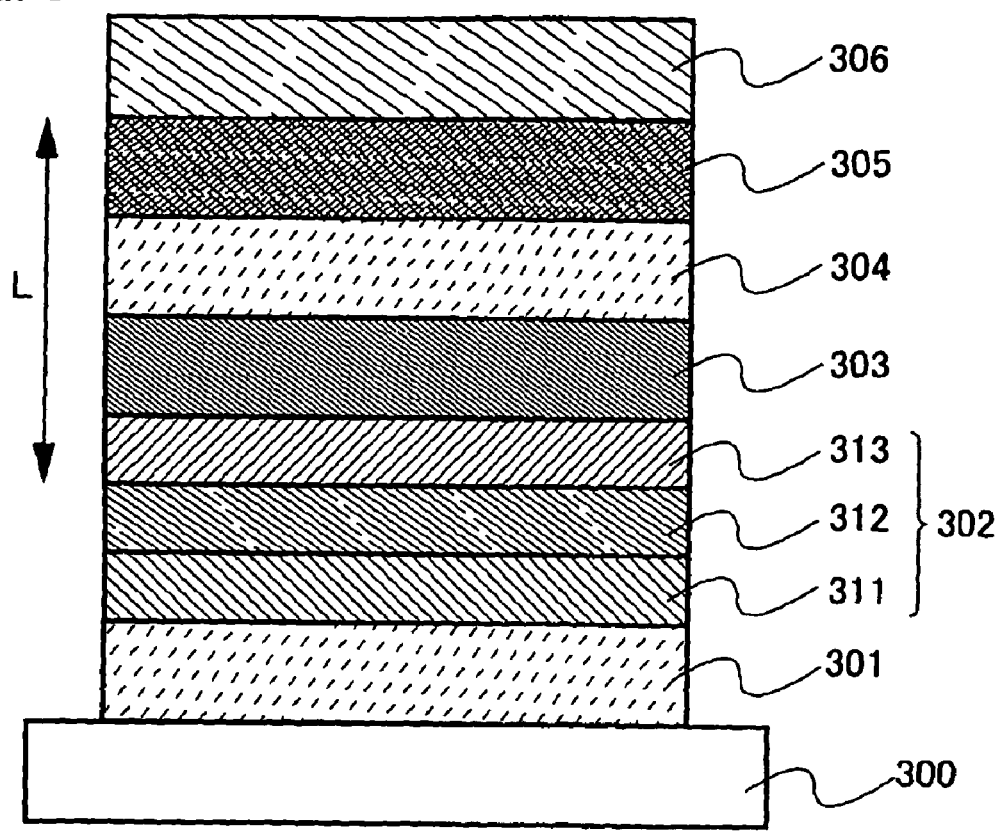
FIG. 3 illustrates an element structure of a light-emitting element according to the present invention.

This embodiment describes a structure of a light-emitting element according to the present invention with reference to FIG. 3.

First, an anode 301 of a light-emitting element is formed over a substrate 300. Specifically, the anode 301 is formed with ITO, a transparent conductive film, in 110 nm thick by a sputtering method. The anode 301 has a length of 2 mm on a side.

Next, a first layer 302 containing a light-emitting material is formed over the anode 301. The first layer 302 containing the light-emitting material in this embodiment has a multilayer structure including three layers 311, 312, and 313.

The substrate with the anode 301 formed thereover is fixed onto a substrate holder in a vacuum evaporation apparatus in such a way that the surface of the substrate with the anode 301 formed faces downward, and copper phthalocyanine (hereinafter referred to as Cu-Pc) is introduced into an evaporation source equipped inside the vacuum evaporation apparatus. Then, a hole-injecting layer 311 containing a hole-injecting material is formed in 20 nm thick by an evaporation method using a resistance heating method. The material for the hole-injecting layer 311 can be a known hole-injecting material.

Next, a hole-transporting layer 312 is formed with a material superior in hole-transporting properties. As the material for the hole-transporting layer 312, a known hole-transporting material can be used. In this embodiment, α-NPD is formed in 40 nm thick by the same method.

Subsequently, a light-emitting layer 313 is formed. As the material for the light-emitting layer 313, a known light-emitting material can be employed. In this embodiment, $Alq_3$ is formed in 40 nm thick by the same method.

In this way, the three layers 311, 312, and 313 are stacked. Next, a second layer 303 is formed. In this embodiment, the second layer 303 is formed in 30 nm thick by a co-evaporation method in such a way that $Alq_3$ is used as an electron-transporting material (host material) and Mg is used as a material (guest material) having electron-supplying properties to $Alq_3$. The proportion of the guest material is set 1 mass %.

Next, a third layer 304 is formed. In this embodiment, ITO is used to form a transparent conductive layer in 140 nm thick.

Next, a fourth layer 305 is formed. In this embodiment, the fourth layer 305 is formed in 150 nm thick by a co-evaporation method in such a way that α-NPD is used as a hole-transporting material (host material) and molybdenum oxide is used as a material (guest material) having electron-receiving properties to α-NPD. The proportion of the guest material is set 25 mass %.

Next, a cathode 306 is formed by a sputtering method or an evaporation method. In this embodiment, the cathode 306 is obtained by forming aluminum in 150 nm thick over the fourth layer 305 by an evaporation method.

Through the above steps, a light-emitting element of the present invention is formed. In the structure shown in this embodiment, light generated by the recombination of the carriers in the layer containing the light-emitting material, that is, the first layer is emitted from the anode 301 to the outside.

In the structure shown in this embodiment, the fourth layer is provided between ITO serving as the third layer and aluminum serving as the cathode; therefore, ITO and aluminum are not in direct contact. This can prevent the electric erosion due to the difference in the self-potential between ITO and aluminum.

Further, since the thicknesses of the third layer and the fourth layer can be set freely, the optical length L from the light-emitting region in the first layer to the cathode formed with the reflective metal can be optimized more easily.

Moreover, since the carriers can be generated from the third layer, the moving distance of the electrons is shorter than that in the element having a conventional structure. Therefore, the drive voltage can be decreased.

Embodiment 2

Figure 4:
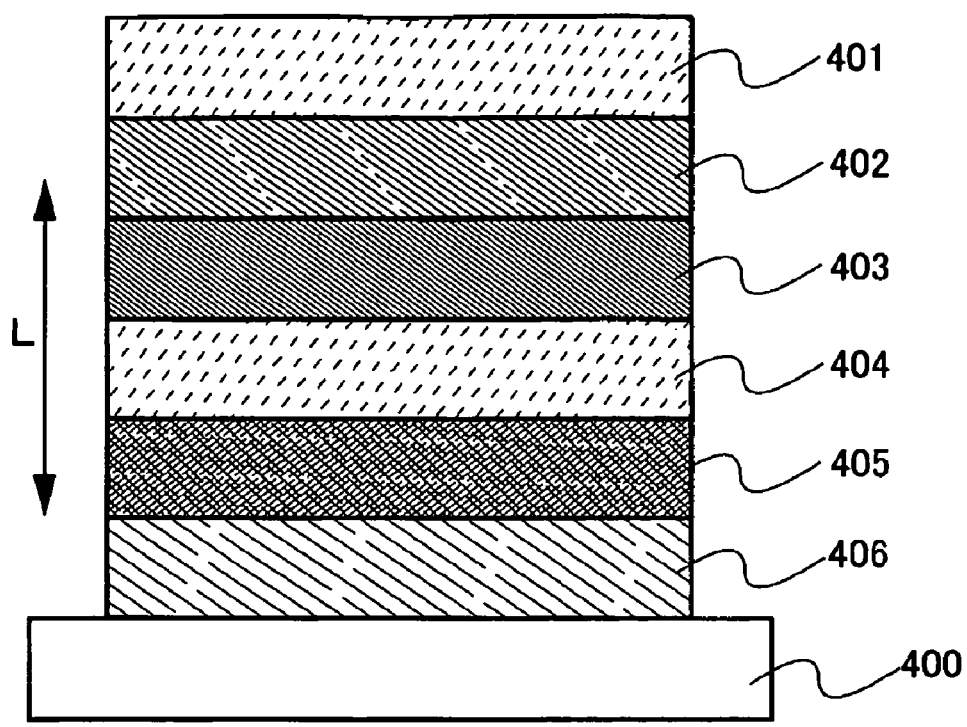
FIG. 4 illustrates an element structure of a light-emitting element according to the present invention.

This embodiment describes a structure of a light-emitting element according to the present invention with reference to FIG. 4.

Since a substrate 400, an anode 401, a first layer 402, a second layer 403, a third layer 404, a fourth layer 405, and a cathode 406 can be formed with the same material and in the same way as those in Embodiment Mode 1, the description is omitted.

In FIG. 4, the cathode 406 is formed over the substrate 400, the fourth layer 405 is formed over the cathode 406, the third layer 404 is formed over the fourth layer 405, the second layer 403 is formed over the third layer 404, the first layer 402 containing the light-emitting material is formed over the second layer 403, and the anode 401 is formed over the first layer 402.

In the structure shown in this embodiment, light generated by the recombination of the carriers in the layer containing the light-emitting material, that is, the first layer is emitted from the anode 401 to the outside.

Even in this structure shown in this embodiment, the same advantage as that obtained by the structure shown in Embodiment 1 can be obtained. Specifically, since the fourth layer is provided between the third layer and the cathode, the electric erosion due to the difference in the self-potential can be prevented. Moreover, since the film thicknesses of the third layer and the fourth layer can be set freely, the optical length L from the light-emitting region in the first layer to the cathode formed with the reflective metal can be optimized more easily. Moreover, the travel distance of the electrons is shorter than that in the element having a conventional structure because the carrier can be generated from the third layer; therefore, the drive voltage can be decreased.

Embodiment 3

This embodiment describes a light-emitting device having a light-emitting element according to the present invention in its pixel portion with reference to FIGS. 5A and 5B. FIG. 5A is a top view showing the light-emitting device, while FIG. 5B is a cross-sectional view taken along A-A' in FIG. 5A. A reference numeral 501 shown with a dotted line denotes a driver circuit portion (source side driver circuit); 502, a pixel portion; 503, a driver circuit portion (gate side driver circuit); 504, a seal substrate; 505, a seal material; and 507, a space surrounded by the seal material 505.

A reference numeral 508 denotes a wiring for transmitting signals to be inputted into the source side driver circuit 501 and the gate side driver circuit 503 and receiving signals such as a video signal, a clock signal, a start signal, and a reset signal from an FPC (flexible printed circuit) 509 serving as an external input terminal. Although only the FPC is illustrated here, a print wiring board (PWB) may be attached to this FPC and the light-emitting device in this specification may include not only the light-emitting device itself but also the light-emitting device with the FPC or the PWB attached thereto.

Next, the cross-sectional structure is described with reference to FIG. 5B. The driver circuit portion and the pixel portion are formed over an element substrate 510. In this embodiment, the source side driver circuit 501, which is the driver circuit portion, and the pixel portion 502 are shown.

In the source side driver circuit 501, a CMOS circuit is formed in which an n-channel TFT 523 and a p-channel TFT 524 are combined. Further, a TFT for forming the driver circuit may be formed with a known CMOS circuit, PMOS circuit, or NMOS circuit. Although this embodiment shows an example of having the pixel portion and the driver circuit formed over the same substrate, the present invention is not limited to this, and the driver circuit can also be formed outside, not over the same substrate as the pixel portion.

The pixel portion 502 is formed with a plurality of pixels including a switching TFT 511, a current control TFT 512, and a first electrode 513 connected electrically with a drain of the current control TFT. An insulator 514 is formed so as to cover the end portion of the first electrode 513. Here, a positive photosensitive acrylic resin film is used as the insulator 514.

In order to improve the coverage, the insulator 514 is formed so as to have curvature at its upper end or lower end. For example, in the case of using positive photosensitive acrylic for the insulator 514, only the upper end portion of the insulator 514 preferably has a radius of curvature of 0.2 to 0.3 µm. The insulator 514 may be formed with either a negative type, which becomes insoluble to the etchant by the irradiation of light, or a positive type, which becomes soluble to the etchant by the irradiation of light. Not only the organic compound but also an inorganic compound such as silicon oxide, silicon oxynitride, a siloxane material, or the like can be used.

First to fourth layers 516 and a second electrode 517 are formed over the first electrode 513. The first electrode 513 is preferably formed with a light-transmitting material such as indium tin oxide (ITO), indium tin oxide containing silicon, or indium tin oxide containing zinc oxide (ZnO) by 2 to 20%.

The first to fourth layers 516 are formed by an evaporation method using an evaporation mask or an inkjet method. The first to fourth layers 516 include a first layer containing a light-emitting material, a second layer, a third layer including a transparent conductive film, and a fourth layer, wherein the first layer, the second layer, the third layer, and the fourth layer are stacked sequentially from the anode toward the cathode, and wherein the fourth layer is formed so as to contact the cathode. As the material for the layer containing the light-emitting material, an organic compound is generally used in a single-layer, multilayer, or a mixed-layer structure. However, in the present invention, an inorganic compound may also be used as a part of a film containing the organic compound.

As the material for the second electrode (cathode) 517 formed over the first to fourth layers 516, metal having high reflectivity is preferable. For example, aluminum (Al), silver (Ag), or alloy containing Al or Ag such as AlLi alloy or MgAg alloy can be used.

Further, a light-emitting element 518 is provided within the space 507 surrounded by the element substrate 510, the seal substrate 504, and the seal material 505 by pasting the seal substrate 504 and the element substrate 510 with the seal material 505. The space 507 is filled with a filling material, for example inert gas such as nitrogen or argon, or the seal material 505.

An epoxy resin is preferably used for the sealing material 505. It is desirable that these materials do not transmit oxygen or moisture as much as possible. As the material for the seal substrate 504, a glass substrate, a quartz substrate, a plastic substrate made of FRP (Fiberglass-Reinforced Plastics), PVF (polyvinyl fluoride), mylar, polyester, acrylic, or the like can be used.

As thus described, a light-emitting device having a light-emitting element according to the present invention can be obtained.

Embodiment 4

For example, various electric appliances each of which has a light-emitting device having a light-emitting element of the present invention as its display portion can be provided.

Electric appliances manufactured using light-emitting devices having light-emitting elements according to the present invention are, for example, a camera such as a video camera or a digital camera, a goggle type display (head mount display), a navigation system, a sound reproduction device (such as a car audio or an audio component), a personal computer, a game machine, a mobile information terminal (such as a mobile computer, a mobile phone, a mobile game machine, or an electronic book), an image reproduction apparatus (such as an apparatus which can reproduce a recording medium such as a digital video disk (DVD) and is equipped with a display device capable of displaying the image) and the like. These electric appliances are specifically shown in FIGS. 6A to 6E.

FIG. 6A shows a television receiving machine including a case 9101, a supporting stand 9102, a display portion 9103, speaker portions 9104, a video input terminal 9105, and the like. The television receiving machine is manufactured by using the light-emitting device having the light-emitting element of the present invention in its display portion 9103. It is to be noted that the television receiving machine includes all the information display devices for a computer, TV broadcast reception, advertisement display, and so on.

FIG. 6B shows a personal computer including a main body 9201, a case 9202, a display portion 9203, a keyboard 9204, an external connection port 9205, a pointing mouse 9206, and the like. The personal computer is manufactured by using the light-emitting device having the light-emitting element of the present invention in its display portion 9203.

FIG. 6C shows a goggle-type display (head mount display) including a main body 9301, display portions 9302, arm portions 9303, and the like. The goggle-type display is manufactured by using the light-emitting device having the light-emitting element of the present invention in its display portion 9302.

FIG. 6D shows a mobile phone including a main body 9401, a case 9402, a display portion 9403, an audio input portion 9404, an audio output portion 9405, operation keys 9406, an external connection port 9407, an antenna 9408, and the like. The mobile phone is manufactured by using the light-emitting device having the light-emitting element of the present invention in its display portion 9403. The power consumption of the mobile phone can be suppressed by displaying white letters on a black background.

FIG. 6E shows a video camera including a main body 9501, a display portion 9502, a case 9503, an external connection port 9504, a remote control receiving portion 9505, an image receiving portion 9506, a battery 9507, an audio input portion 9508, operation keys 9509, an eyepiece portion 9510, and the like. The video camera is manufactured by using the light-emitting device having the light-emitting element of the present invention in its display portion 9502.

As thus described, the light-emitting device having the light-emitting element according to the present invention can be applied in an extremely wide range, and this light-emitting device can be applied to electric appliances of every field. By using the light-emitting element of the present invention, the optical length to the reflective metal from the light-emitting region in the layer containing the light-emitting material can be optimized without increasing the drive voltage.

EXPLANATION OF REFERENCE

101: ANODE, 102: FIRST LAYER, 103: SECOND LAYER, 104: THIRD LAYER, 105: FOURTH LAYER, 106: CATHODE, 201: TRANSPARENT ELECTRODE, 202: LIGHT-EMITTING PORTION, 203: TRANSPARENT CONDUCTIVE FILM, 204: METAL ELECTRODE, 300: SUBSTRATE, 301: ANODE, 302: FIRST LAYER, 303: SECOND LAYER, 304: THIRD LAYER, 305: FOURTH LAYER, 306: CATHODE, 311: HOLE-INJECTING LAYER, 312: HOLE-TRANSPORTING LAYER, 313: LIGHT-EMIT.TING LAYER, 400: SUBSTRATE, 401: ANODE, 402: FIRST LAYER, 403: SECOND LAYER, 404: THIRD LAYER, 405: CATHODE, 501: SOURCE SIDE DRIVER CIRCUIT, 502: PIXEL PORTION, 503: GATE SIDE DRIVER CIRCUIT, 504: SEAL SUBSTRATE, 505: SEAL MATERIAL, 507: SPACE, 509: FPC (FLEXIBLE PRINTED CIRCUIT), 510: ELEMENT SUBSTRATE, 511: SWITCHING TFT, 512: CURRENT CONTROL TFT, 513: FIRST ELECTRODE, 514: INSULATOR, 516: LAYER, 517: SECOND ELECTRODE, 518: LIGHT-EMITTING ELEMENT, 523: N-CHANNEL TFT, 524: P-CHANNEL TFT, 9101: CASE, 9102: SUPPORTING STAND, 9103: DISPLAY PORTION, 9104: SPEAKER PORTIONS, 9105: VIDEO INPUT TERMINAL., 9201: MAIN BODY, 9202: CASE, 9203:DISPLAY PORTION, 9204: KEYBOARD, 9205: EXTERNAL CONNECTION PORT, 9206: POINTING MOUSE, 9301: MAIN BODY, 9302: DISPLAY PORTIONS, 9303: ARM PORTIONS, 9401:MAIN BODY, 9402: CASE, 9403: DISPLAY PORTION, 9404: AUDIO INPUT PORTION, 9405: AUDIO OUTPUT PORTION, 9406: OPERATION KEYS, 9407: EXTERNAL CONNECTION PORT, 9408: ANTENNA, 9501: MAIN BODY, 9502: DISPLAY PORTION, 9503: CASE, 9504: EXTERNAL CONNECTION PORT, 9505: REMOTE CONTROL RECEIVING PORTION, 9506: IMAGE RECEIVING PORTION, 9507: BATTERY, 9508: AUDIO INPUT PORTION, 9509: OPERATION KEYS, 9510: EYEPIECE PORTION

The invention claimed is:
1. A light-emitting device comprising:
an anode containing a light-transmitting material;
a first layer containing a light-emitting material over the anode;
a second layer containing an organic compound and an electron-supplying material over the first layer;
a third layer including a transparent conductive film over the second layer;
a fourth layer containing a hole transporting material over the third layer, the fourth layer being in direct contact with the third layer; and
a cathode containing reflective metal over the fourth layer, the cathode being in direct contact with the fourth layer,
wherein the transparent conductive film comprises at least one material selected from the group consisting of indium tin oxide, indium tin oxide containing silicon, and indium oxide containing zinc oxide by 2 to 20%.

2. A light-emitting device comprising:
an anode;
a first layer containing a light-emitting material over the anode;
a second layer containing an organic compound and an electron-supplying material over the first layer;
a third layer including a transparent conductive film over the second layer;
a fourth layer containing a hole transporting material over the third layer, the fourth layer being in direct contact with the third layer; and
a cathode over the fourth layer, the cathode being in direct contact with the fourth layer,
wherein the transparent conductive film comprises at least one material selected from the group consisting of indium tin oxide, indium tin oxide containing silicon, and indium oxide containing zinc oxide by 2 to 20%.

3. The light-emitting device according to claim 1 or 2, wherein the reflective metal comprises at least one material selected from the group consisting of aluminum, silver, alloy containing aluminum, or alloy containing silver.

4. The light-emitting device according to claim 1 or 2, wherein the transparent conductive film is not in direct contact with the reflective metal.

5. The light-emitting device according to claim 1 or 2, wherein the organic compound contained in the second layer comprises an organic compound having electron-transporting properties.

6. The light-emitting device according to claim 1 or 2, wherein the organic compound contained in the second layer comprises a metal complex having a ligand including a t-conjugated skeleton.

7. The light-emitting device according to claim 1 or 2, wherein the electron-supplying material comprises at least one material selected from the group consisting of alkali metal, alkali-earth metal, and rare-earth metal.

8. The light-emitting device according to claim 1 or 2, wherein the electron-supplying material comprises at least one material selected from the group consisting of Li, Cs, Mg, Ca, Ba, Er, and Yb.

9. The light-emitting device according to claim 1 or 2, wherein the hole transporting material contained in the fourth layer comprises an inorganic compound.

10. The light-emitting device according to claim 9, wherein the hole-transporting material containing the inorganic compound comprises a P-type semiconductor.

11. The light-emitting device according to claim 10, wherein the P-type semiconductor comprises at least one material selected from the group consisting of vanadium oxide, chromium oxide, molybdenum oxide, cobalt oxide, nickel oxide, and a compound containing two or more of vanadium oxide, chromium oxide, molybdenum oxide, cobalt oxide, and nickel oxide.

12. The light-emitting device according to claim 1 or 2, wherein the hole transporting material contained in the fourth layer comprises an organic compound.

13. The light-emitting device according to claim 12, wherein the hole-transporting material is an organic compound having an aromatic amine skeleton.

14. The light-emitting device according to claim 1 or 2, wherein the hole transporting material contained in the fourth layer comprises a material doped with a material having electron-receiving properties to an organic compound.

15. The light-emitting device according to claim 14, wherein the material having electron-receiving properties comprises metal oxide.

16. The light-emitting device according to claim 14, wherein the material having electron-receiving properties comprises at least one material selected from the group consisting of molybdenum oxide, vanadium oxide, rhenium oxide, and a compound containing two or more of molybdenum oxide, vanadium oxide, and rhenium oxide.

17. An electronic device comprising a light emitting device according to any one of claims 1 and 2, wherein the electronic device is one selected from the group consisting of a television receiving machine, a personal computer, head mount display, a mobile phone and a video camera.

18. The light-emitting device according to claim 1, wherein the first layer includes a light-emitting layer containing the light-emitting material, and electron-injecting layer, and electron-transporting layer, a hole-blocking layer, a hole-transporting layer, and a hole-injecting layer.

19. The light-emitting device according to claim 1, wherein the third layer is in direct contact with the second layer.

20. A light-emitting device comprising a light-emitting material, the light-emitting device comprising:
an anode;
a cathode;
a first layer containing the light-emitting material between the anode and the cathode;
a second layer containing an organic compound and an electron-supplying material between the first layer and the cathode;
a third layer including a transparent conductive film between the second layer and the cathode; and
a fourth layer containing a hole transporting material between the third layer and the cathode,
wherein the fourth layer is in direct contact with the third layer and the cathode, and
wherein the transparent conductive film comprises at least one material selected from the group consisting of indium tin oxide, indium tin oxide containing silicon, and indium oxide containing zinc oxide by 2 to 20%.

21. The light-emitting device according to claim 20, wherein the cathode comprises at least one material selected from the group consisting of aluminum, silver, alloy containing aluminum, or alloy containing silver.

22. The light-emitting device according to claim 20, wherein the anode comprises at least one material selected from the group consisting of indium tin oxide, indium tin oxide containing silicon, and indium oxide containing zinc oxide by 2 to 20%.

23. The light-emitting device according to claim 20, wherein the organic compound contained in the second layer comprises an organic compound having electron-transporting properties.

24. The light-emitting device according to claim 20, wherein the organic compound contained in the second layer comprises a metal complex having a ligand including a 7c-conjugated skeleton.

25. The light-emitting device according to claim 20, wherein the electron-supplying material comprises at least one material selected from the group consisting of alkali metal, alkali-earth metal, and rare-earth metal.

26. The light-emitting device according to claim 20, wherein the electron-supplying material comprises at least one material selected from the group consisting of Li, Cs, Mg, Ca, Ba, Er, and Yb.

27. The light-emitting device according to claim 20, wherein the hole transporting material contained in the fourth layer comprises an inorganic compound.

28. The light-emitting device according to claim 27, wherein the hole-transporting material containing the inorganic compound comprises a P-type semiconductor.

29. The light-emitting device according to claim 28, wherein the P-type semiconductor comprises at least one material selected from the group consisting of vanadium oxide, chromium oxide, molybdenum oxide, cobalt oxide, nickel oxide, and a compound containing two or more of vanadium oxide, chromium oxide, molybdenum oxide, cobalt oxide, and nickel oxide.

30. The light-emitting device according to claims 20, wherein the hole transporting material contained in the fourth layer comprises an organic compound.

31. The light-emitting device according to claim 30, wherein the hole-transporting material is an organic compound having an aromatic amine skeleton.

32. The light-emitting device according to claims 20, wherein the hole transporting material contained in the fourth layer comprises a material doped with a material having electron-receiving properties to an organic compound.

33. The light-emitting device according to claim 32, wherein the material having electron-receiving properties comprises metal oxide.

34. The light-emitting device according to claim 32, wherein the material having electron-receiving properties comprises at least one material selected from the group consisting of molybdenum oxide, vanadium oxide, rhenium oxide, and a compound containing two or more of molybdenum oxide, vanadium oxide, and rhenium oxide.

35. An electronic device comprising a light emitting device according to claim 20, wherein the electronic device is one selected from the group consisting of a television receiving machine, a personal computer, head mount display, a mobile phone and a video camera.

* * * * *

UNITED STATES PATENT AND TRADEMARK OFFICE
CERTIFICATE OF CORRECTION

| | | |
|---|---|---|
| PATENT NO. | : 8,008,651 B2 | Page 1 of 1 |
| APPLICATION NO. | : 10/575202 | |
| DATED | : August 30, 2011 | |
| INVENTOR(S) | : Daisuke Kumaki and Satoshi Seo | |

It is certified that error appears in the above-identified patent and that said Letters Patent is hereby corrected as shown below:

In the Claims:

Column 12, Line 59, Claim 24; Change "7c-conjugated" to --π-conjugated--.

Signed and Sealed this
Seventeenth Day of April, 2012

David J. Kappos
*Director of the United States Patent and Trademark Office*